(12) United States Patent
Wang et al.

(10) Patent No.: US 6,807,454 B2
(45) Date of Patent: Oct. 19, 2004

(54) METHOD FOR AUTOMATICALLY CONTROLLING DEFECT -SPECIFICATION IN A SEMICONDUCTOR MANUFACTURING PROCESS

(75) Inventors: Sheng-Jen Wang, Hsin-Chu (TW); Long-Hui Lin, Hsin-Chu (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/249,103

(22) Filed: Mar. 17, 2003

(65) Prior Publication Data

US 2003/0212469 A1 Nov. 13, 2003

(30) Foreign Application Priority Data

May 8, 2002 (TW) ........................................ 91109606 A

(51) Int. Cl.⁷ .............................................. G06F 19/00
(52) U.S. Cl. ........................................ 700/121; 700/110
(58) Field of Search .......................... 700/108–110, 121; 382/149; 438/14

(56) References Cited

U.S. PATENT DOCUMENTS 5,801,965 A * 9/1998 Takagi et al. ................. 702/35
5,923,430 A * 7/1999 Worster et al. .............. 356/394
5,991,699 A * 11/1999 Kulkarni et al. .............. 702/83
6,292,582 B1 * 9/2001 Lin et al. ..................... 382/149
6,314,379 B1 * 11/2001 Hu et al. ....................... 702/81
6,408,219 B2 * 6/2002 Lamey et al. ................ 700/110
6,535,776 B1 * 3/2003 Tobin et al. .................. 700/110

* cited by examiner

Primary Examiner—Leo Picard
Assistant Examiner—Ryan Jarrett
(74) Attorney, Agent, or Firm—Winston Hsu

(57) ABSTRACT

A method for automatically controlling defect-specification in a semiconductor manufacturing process is provided. The method provides a module to detect a position, number, size, and intensity signals of defects on a processed patterned wafer. The module further compares the patterned wafer with a normal wafer to preliminarily classify the patterned wafer and creates a defect map. Then, a defect management system is provided to execute a spatial pattern recognition procedure to determine whether or not the corresponding special pattern can be recognized. Finally, messages will be automatically sent by the defect management system to inform related e-mail accounts according to results of the recognition of the special pattern.

10 Claims, 4 Drawing Sheets

METHOD FOR AUTOMATICALLY CONTROLLING DEFECT-SPECIFICATION IN A SEMICONDUCTOR MANUFACTURING PROCESS

BACKGROUND OF INVENTION

1. Field of the Invention

The present invention relates to a semiconductor manufacturing process, and more particularly, to a method for automatically controlling defect-specification in a semiconductor manufacturing process when performing detection on wafers and monitoring particles.

2. Description of the Prior Art

In a semiconductor manufacturing process, high accuracy is required for processing control, equipment operation, and raw material manufacturing. Any slight mistake in any of the processes leads to wafer failure. Therefore, the wafer needs to be detected during each processing stage. If a wafer fails to pass the detection, the reason for generating defects on the wafer is analyzed step by step to ensure the quality of the wafer product and to monitor the operation of equipment and modules on a production line effectively.

Please refer to FIG. 1, which is a flow chart of a prior art method for automatically controlling defect-specification. As shown in FIG. 1, a patterned wafer 60 is detected. Firstly, at least one wafer in a lot is sampled (step S101). When detecting physical defects of the sample wafer, a module is utilized to perform a bright field (BF) defect detection on the sample wafer (step S102) to detect if there are scratches or contamination on the surface of the physical wafer. If the preliminary result indicates that the physical wafer is abnormal, an engineer is informed to inspect the sample wafer by utilizing an optical microscope (OM) and to preliminarily classify the sample wafer according to the defects and the engineer's experience (step S103). When detecting if there are particles adhered to the surface of the sample wafer, another module is utilized to perform a dark field (DF) defect detection on the sample wafer (step S104).

No matter how the detected sample wafer is classified, a defect management system is utilized to perform an analysis (step S105). If the spatial pattern on the surface of the sample wafer is regarded as acceptable, the defect management procedure for the sample wafer is ended. If the spatial pattern on the surface of the sample wafer is still regarded as abnormal, a scanning electron microscope (SEM) is utilized by an engineer to inspect the sample wafer first, and then the defect type on the sample wafer is empirically determined (step S106). If the sample wafer is regarded as acceptable after being inspected by the scanning electron microscope, it passes the detection.

However, the prior art method for wafer detection classifies the defect type according to an engineer's personal experience, very easily leading to mistakes. For the defective wafers having special spatial patterns, the related staffs are not informed until the engineer makes an empirical judgment according to his personal experience. Since the related staffs are not informed to do a correction until the judgment is made, unexpected defect problems on the production line cannot be known in time. As a result, the throughputs of the module and the cycle time for products are affected. In addition, the inspecting engineer's personal experience is difficult to transfer. It is thus difficult for new engineers to judge the defect type correctly when the original engineer resigns or is promoted. Furthermore, the prior art method for detecting the physical defects on the wafer utilizes an optical microscope to inspect the sample wafer and empirically classify the defects. As a result, the cost and man-hours are increased.

It is therefore very important to provide a method for automatically controlling defect-specification in the semiconductor manufacturing process to solve the above-mentioned problems.

SUMMARY OF INVENTION

It is a primary objective of the claimed invention to provide a method for automatically controlling defect-specification in a semiconductor manufacturing process to automatically classify the defects on a wafer, to reduce mistakes due to misjudgment, to shorten the standby time, and not to affect the throughputs of the module.

It is another primary objective of the claimed invention to provide a method for automatically controlling defect-specification in a semiconductor manufacturing process. Based on the special spatial patterns, possibly faulty equipment and a solution are automatically found to decrease the generation of defective wafers.

It is yet another primary objective of the claimed invention to provide a method for automatically controlling defect-specification in a semiconductor manufacturing process to effectively sample the defects on the wafer to increase the throughputs of the module and to shorten the cycle time for products.

The claimed invention method first samples at least one wafer from a batch of wafers. Then a module is utilized to detect the physical property of each sample wafer to detect a position, number, size, and intensity signals of defects on the sample wafer. The sample wafer is compared with a normal wafer to preliminarily classify the sample wafer according to the discrepancies of signals and create a defect map by utilizing the module. The defect map comprises a spatial pattern of defects on the sample wafer. Thereafter, a defect management system is utilized to analyze the preliminarily classified defect map to detect wafers having defects. A spatial pattern recognition procedure is executed by utilizing the defect management system to determine whether or not the defect map is recognized by a plurality of specific patterns stored in the defect management system. Each of the specific patterns corresponds to a defect type on the wafer and each defect type corresponds to at least a related operator, related equipment, and a related module. After searching for the specific pattern conforming to the defect map indicating the defect type on the sample wafer, the related operator, the related equipment, and the related module are ensured according to the specific pattern. Finally, messages are sent to an account of the related operator by the defect management system according to the defect type on the sample wafer so that the related equipment and the related module are tuned by the related operator according to the defect type on the wafer.

In addition, if the defect management system does not find the specific pattern conforming to the defect map, an optical microscope and a scanning electron microscope are utilized by the defect management system to inspect the sample wafer to finely classify the defects on the sample wafer. If the results of fine classification of the defects indicate that the sample wafer cannot pass the detection, messages are sent to an account of an analyst by the defect management system to ask the analyst to analyze the reason for the defects occurring on the sample wafer.

It is an advantage of the claimed invention that the objective and means of the claimed invention method are automatic. Therefore, the function is improved when applying the claimed invention method to the industry.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
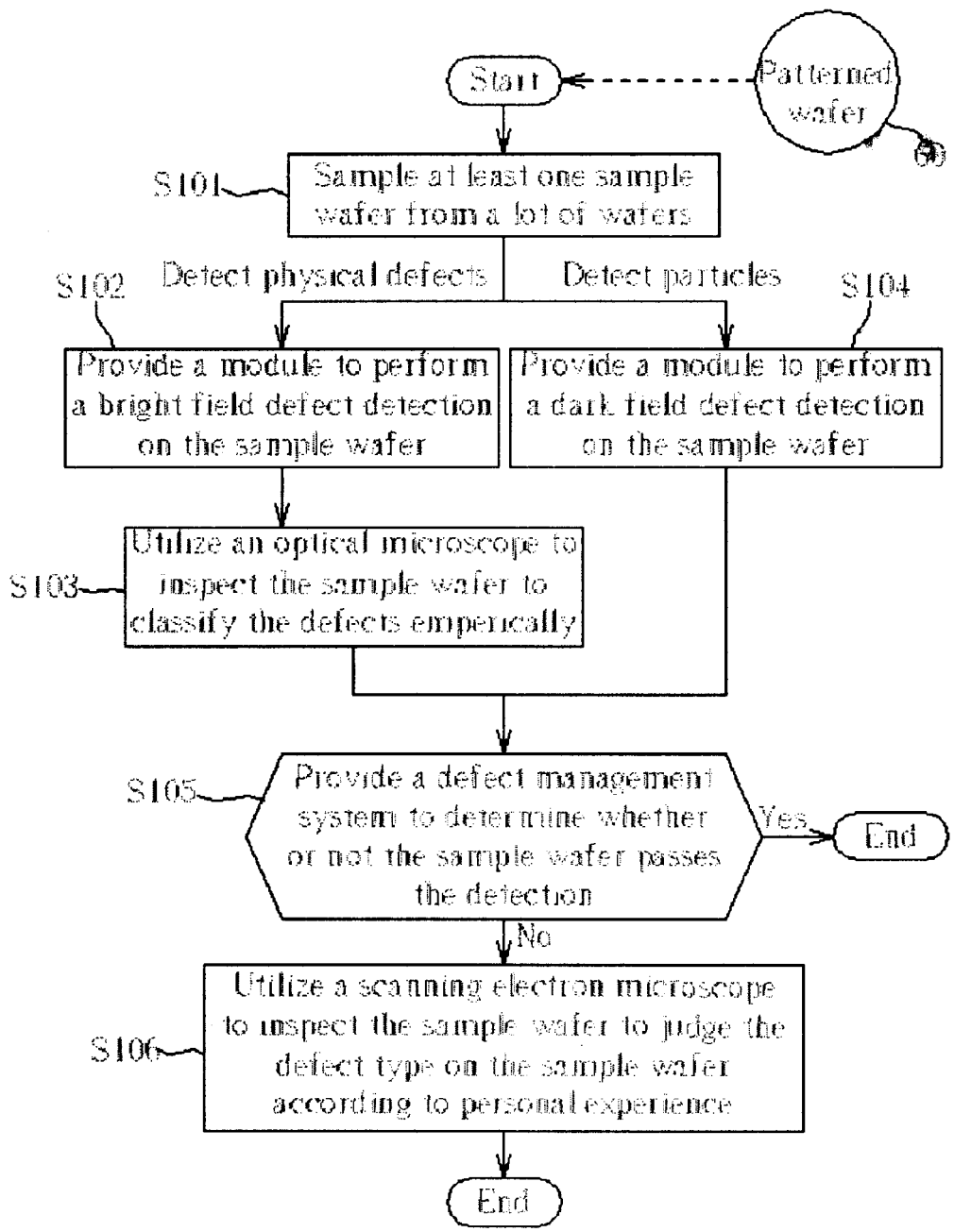
FIG. 1 is a flow chart of a prior art method for automatically controlling defect-specification.
Figure 2:
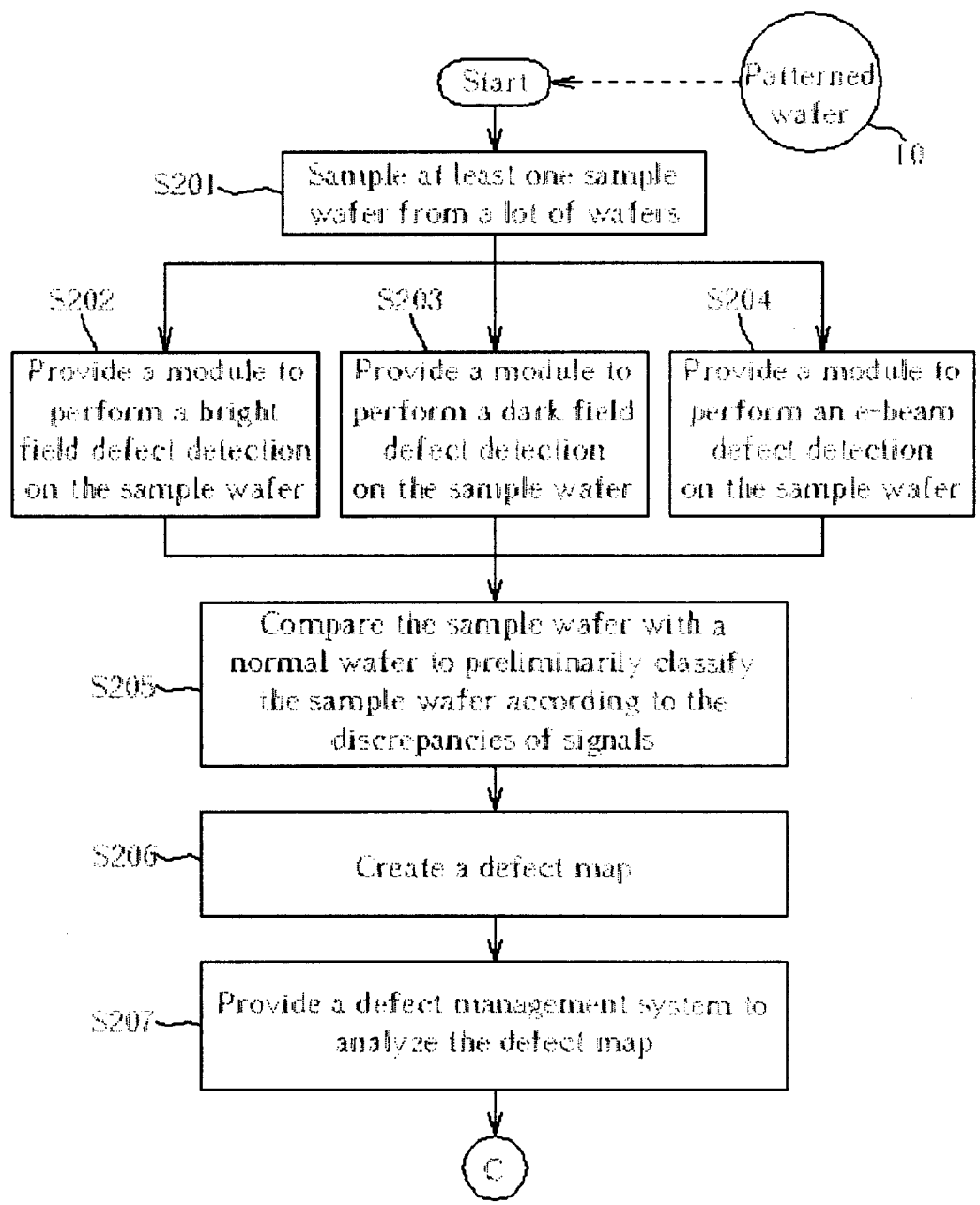
FIG. 2 and FIG. 3 are flow charts of a method for automatically controlling defect-specification in a semiconductor manufacturing process according to the present invention.
Figure 3:
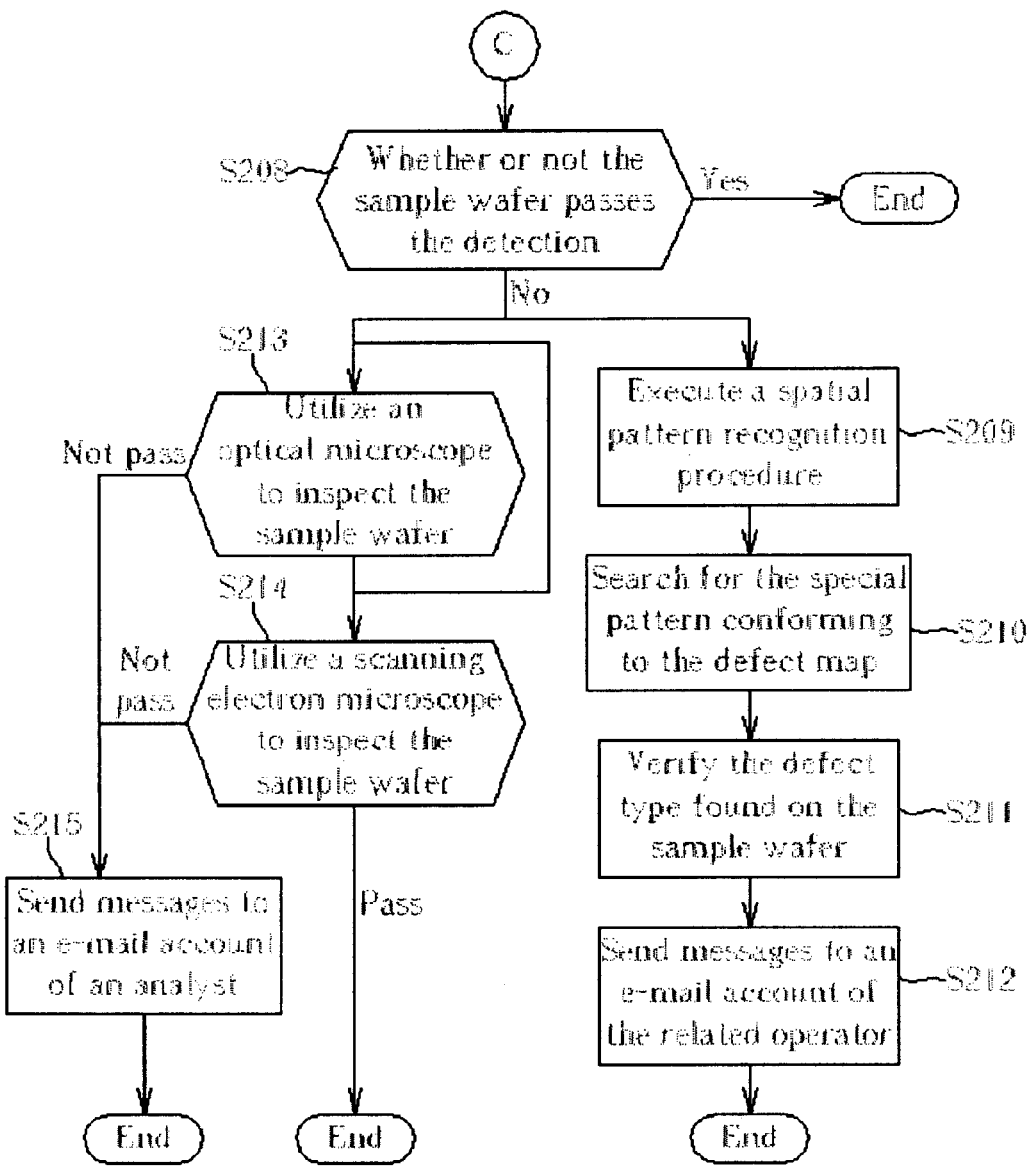

Please refer to FIG. 2 and FIG. 3, which are flow charts of a method for automatically controlling defect-specification in a semiconductor manufacturing process according to a preferred embodiment of the present invention. The method according to the preferred embodiment of the present invention is applied in a semiconductor manufactory to control defects and particles on produced wafers. As shown in FIG. 2 and FIG. 3, at least one sample wafer in a lot of patterned wafers 10 is sampled (step S201) first. Since the method according to the preferred embodiment of the present invention is for detecting the physical properties of the sample wafer, a module is utilized to perform a bright field defect detection on the sample wafer (step S202) to detect a position, number, size, and intensity signals of physical defects on the sample wafer. Then, the sample wafer is compared with a normal wafer to preliminarily classify the sample wafer according to the discrepancies of signals (step S205). The discrepancies of signals comprise the discrepancy of length between wafers, the discrepancy of width between wafers, the discrepancy of height between wafers, the discrepancy, of roughness between wafers, and the discrepancy of intensity of reflective lights between wafers, etc. It is worth noticing that the comparisons of the sample wafer is not limited to comparison with a normal wafer. The portion of the sample wafer having defects may be compared with the normal portions of the sample wafer to obtain the discrepancies of signals to preliminarily classify the sample wafer.

Furthermore, a module may be utilized to perform a dark field defect detection on the sample wafer (step S203) when detecting the physical properties of the sample wafer. The position, number, size, and intensity signals of particles on the sample wafer are thus detected. The sample wafer is then compared with a normal wafer to preliminarily classify the sample wafer according to the discrepancies of signals between the sample water and the normal wafer (step S205). Actually, the method is not limited in detecting the physical properties of sample wafer. In the present invention method, a module may be utilized to perform an electron beam (e-beam) defect detection on the sample wafer (step S204). Similarly, the sample wafer is preliminarily classified after comparing the sample wafer with a normal wafer to obtain discrepancies of signals (step S205).

After that, the module creates a defect map comprising a spatial pattern of defects on the sample wafer (step S206). A defect management system is utilized to analyze the defect map (step S207). The defect management system judges whether or not the sample wafer can pass the detection according to a bar chart or relative data based on the defect map (step S208). For example, the axis of the abscissa in the bar chart may represent the reflective signals incurred from bright lights and dark lights incident to the sample wafer. The axis of the ordinate may present the numerical value of the intensity of signals. Or, the axis of the abscissa may represent particles and the axis of the ordinate may present the quantity of particles. The bar chart may include the defect information from the whole wafer detecting procedure, or only include the defect information in a specific detecting flow.

If the results indicate that the sample wafer cannot pass the detection, a spatial pattern recognition procedure is executed to determine whether the defect map is recognized by a plurality of specific patterns stored in the database of the defect management system (step S209). Each of the specific pattern corresponds to a defect type on the wafer, such as the curvilinear pattern, the amorphous pattern, or the residual pattern, etc. Each defect type correspond to a related operator, related equipment, and a related process module. When the specific pattern conforming to the defect map is found by the defect management system (step S210), the defect type on the sample wafer, the related operator, the related equipment, and the related process module are ascertained according to the specific pattern (step S211). Finally, manages are sent to an e-mail account of the related operator by the defect management system according to the defeat type on the sample wafer (step S212) so that the parameters of the related equipment or the related process module are tuned by the related operator according to the defeat type on the sample wafer.

In addition, if the sample wafer cannot pass the detection in step S208 according to the defect map, an optical microscope is utilized by the defect management system to inspect the sample wafer (step S213 and is performed simultaneously with step S209 to shorten man-hours). Or, a scanning electron microscope is utilized to inspect the sample wafer (step S214). The defects on the sample wafer are finely classified according to the automatic defect re-detection technique and the automatic defect classification technique. If the resolution display by the defect map is high, the portion on the sample wafer having defects is observed by utilizing the scanning electron microscope having a higher magnification directly by skipping step S213.

If results of fine classification of the defects indicate that the sample wafer cannot pass the inspection, messages are sent to an e-mail account of an analyst (engineer) by the defect management system (step S215) to ask the analyst to analyze the reason for the occurrence of the defects on the sample wafer.

Figure 4:
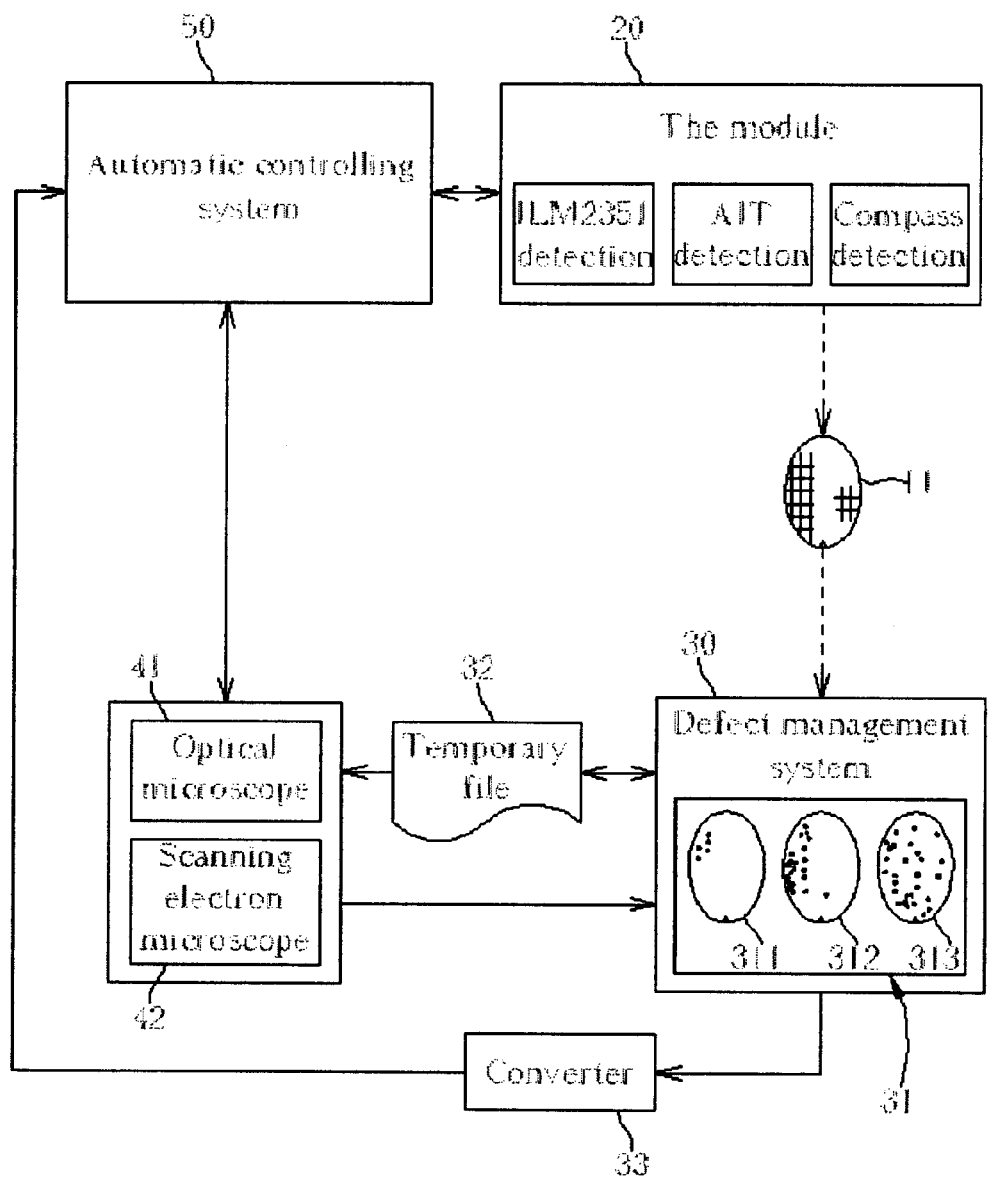
FIG. 4 is a system configuration chart according to the present invention.

Please refer to FIG. 4, which is a system configuration chart according to the present invention. As shown in FIG. 4 and in the above mentioned steps, the module 20 according to the present invention comprises equipment for performing ILM2351 detection, AIT detection, Compass detection, etc. After the module 20 performs a detection on the sample wafer, a defect map 11 corresponding to the sample wafer is created. The defect map 11 is compared with specific patterns 31 stored in the defect management system 30. The specific patterns 31 comprise a curvilinear pattern 311, an amorphous pattern 312, and a residual pattern 313, etc. The defect management system 30 also utilizes an optical microscope 41 and a scanning electron microscope 42 to inspect the defect map 11. It is worth noticing that the information in the defect map 11 is stored in a temporary file 32 because the format of the defect management system 30 does not conform to the formats of the optical microscope 41 and the scanning electron microscope 42. The format is converted in the temporary file 32 to avoid the problem of being unable to perform detection due to incompatibility.

The system configuration chart according to the present invention further comprises an automatic controlling system 50 to manage the incompatible format problem between the instruments and the system. The automatic controlling system 50 can convert the transmission protocol (TP) between the module 20, the defect management system 30, the optical microscope 41, or the scanning electron microscope 42. For example, a converter 33 is between the defect management system 30 and the automatic controlling system 50 to provide on-line spec controlling rule and transmission protocol of files.

The present invention method integrates the features of the module, the defect management system, and each piece of equipment and instrument to provide a total solution method for automatically controlling defect-specification in the process of semiconductor manufacturing. By utilizing the defect management system to classify the defective wafers, misjudgement due to personal experience is reduced to greatly improve the throughputs of the module and the cycle time for products. In addition, the present invention method automatically finds the possibly faulty equipment that processed the defective wafer having special spatial patterns and informs the related operator. The quantity of defective wafers is thus decreased.

In summary, the objective, means, and functioning of the present invention method are totally different from the prior art method. Therefore the present invention method is very useful and valuable. Those skilled in the art will readily observe that numerous modifications and alterations of the system and the method may be made while retaining the teachings of the invention. Accordingly, the above disclosure should be construed as limited only by the metes and bounds of the appended claims.

What is claimed is:

1. A method for automatically controlling defect-specification in a semiconductor manufacturing process, the method comprising:

(A) sampling at least one sample wafer from a batch of wafers;

(B) detecting the physical property of each sample wafer by utilizing a module to detect a position, number, size, and intensity signals of defect on the sample wafer;

(C) comparing the sample wafer with a normal wafer to preliminarily classify the sample wafer according to the discrepancies of signals between the sample wafer and the normal wafer and create a defect map by utilizing the module, the defect map comprising a spatial pattern of defects on the sample wafer;

(D) analyzing the preliminarily classified defect map by utilizing a defect management system to judge whether or not the sample wafer passes the detection;

(E) executing a spatial pattern recognition procedure if the sample wafer cannot pass the detection by utilizing the defect management system to determine whether or not the defect map conforms to at least one of a plurality of specific patterns stored in the defect management system, each of the specific patterns corresponding to a defect type on the wafer, and each defect type corresponding to a related operator, a related equipment, and a related process module;

(F) searching the specific pattern conforming to the defect map to ascertain the defect type on the sample wafer, and the related operator, the related equipment, and the related process module according to the specific pattern; and (G) sanding messages to an account of the related operator by the defect management system according to the defect type on the sample wafer so that the related equipment and the related process module are tuned by the related operator according to the detect type on the wafer.

2. The method of claim 1, wherein the sample wafer is a patterned wafer.

3. The method of claim 2, wherein if the sample wafer cannot pass the detection according to the defect map, the detect management system executes the following steps after step (D):

(H) inspecting the sample wafer by utilizing an optical microscope (OM) and a scanning electron microscope (SEM) to finely classify the defect on the sample wafer; and (I) sending messages to an account of an analyst by the defect management system to ask the analyst to analyze the reason for the defects occurring on the sample wafer if results of fine classification of the defects indicate that the sample wafer cannot pass the inspection.

4. The method of claim 2, wherein the module is utilized to perform a bright field (BF) defect detection in step (B) to detect a position, number, size, and intensity signal of physical defects on the sample wafer.

5. The method of claim 2, wherein the module is utilized to perform a dark field (DF) defect detection in step (B) to detect a position, number, size and intensity signal of particles on the sample wafer.

6. The method of claim 2, wherein the module is utilized to perform an electron beam (e-beam) defeat detection in step (B) to detect a position, number, size, and intensity signal of defects on the sample wafer.

7. The method of claim 2, wherein the defect management system sends messages to an e-mail account of the related operator in step (G).

8. The method of claim 3, wherein the defect management system sends messages to an e-mail account of the related operator in step (I).

9. The method of claim 2, wherein the defect management system is linked with an automatic controlling system to convert the discrepancies of signals compared by the module and the defect map into a format conforming to the format of the defect management system.

10. The method of claim 3, wherein the defect management system is linked with an automatic controlling system to convert the format of the defect management system into a format conforming to the format of the optical microscope and the scanning electron microscope.

* * * * *